US009176185B2

(12) United States Patent
Canegallo et al.

(10) Patent No.: US 9,176,185 B2
(45) Date of Patent: Nov. 3, 2015

(54) ACTIVE PROBE CARD FOR ELECTRICAL WAFER SORT OF INTEGRATED CIRCUITS

(75) Inventors: Roberto Canegallo, Rimini (IT); Mauro Scandiuzzo, Torazza di Cambiago (IT); Roberto Cardu, Bologna (IT); Eleonora Franchi Scarselli, Bologna (IT); Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 436 days.

(21) Appl. No.: 13/558,210

(22) Filed: Jul. 25, 2012

(65) Prior Publication Data

US 2013/0027071 A1   Jan. 31, 2013

(30) Foreign Application Priority Data

Jul. 28, 2011 (IT) .............................. MI2011A1415

(51) Int. Cl.
*G01R 31/02*   (2006.01)
*G01R 31/20*   (2006.01)
*G01R 31/28*   (2006.01)
*G01R 31/302*  (2006.01)

(52) U.S. Cl.
CPC ........ *G01R 31/2889* (2013.01); *G01R 31/3025* (2013.01)

(58) Field of Classification Search
CPC .... G01R 31/02; G01R 31/20; G01R 31/2886; G01R 31/318572; G01R 31/31924; G01R 31/31926; G01R 35/005; G01R 1/073; G01R 1/07307; G01R 31/2889; G01R 1/07342; G01R 1/0408; G01R 1/06711
USPC ............. 324/754.01, 754.03, 754.07, 754.21, 324/755.01, 756.03, 758.01, 690, 696, 724
See application file for complete search history.

(56) References Cited

U.S. PATENT DOCUMENTS

| 6,600,325 | B2 | 7/2003 | Coates et al. |
| 6,781,392 | B1* | 8/2004 | Cheng et al. ............. 324/756.03 |
| 2004/0075453 | A1 | 4/2004 | Slupsky |
| 2005/0174131 | A1 | 8/2005 | Miller |

(Continued)

FOREIGN PATENT DOCUMENTS

JP   2007078407 A   3/2007

OTHER PUBLICATIONS

Daito, Matsuo, et al. "Capacitively Coupled Non-Contract Probing Circuits for Membrane-Based Wafer-Level Simultaneous Testing." ISSCC 2010, Session 7, Designing in Emerging Technologies, p. 7.6, *2010 IEEE International Solid-State Engineering Conference.* 2010 IEEE.

*Primary Examiner* — Patrick Assouad
*Assistant Examiner* — Taqi Nasir
(74) *Attorney, Agent, or Firm* — Seed IP Law Group PLLC

(57) ABSTRACT

A testing apparatus includes a tester and a probe card system that includes a probe card connected to the tester, and an active interposer connected to the probe card and wirelessly coupled with a device to be tested. The active interposer includes pads positioned on its free surface facing the device. The pads are positioned with respect to pads of the device so that each pad of the active interposer faces a pad of the device and is separated therefrom by a dielectric. Each pair of facing pads forms an elementary wireless coupling element which allows a wireless transmission between the active interposer and the device. The active interposer also includes an amplifier circuit configured to amplify wireless signals from the device before forwarding them to the tester. The probe card system includes a transmission element able to transmit a power voltage from the tester to the device.

25 Claims, 7 Drawing Sheets

(56) References Cited

U.S. PATENT DOCUMENTS

| | | | |
|---|---|---|---|
| 2008/0018350 A1* | 1/2008 | Chao et al. | 324/754 |
| 2009/0066350 A1 | 3/2009 | Lee et al. | |
| 2010/0164519 A1* | 7/2010 | Sellathamby et al. | 324/754 |
| 2011/0006794 A1* | 1/2011 | Sellathamby et al. | 324/754.03 |

* cited by examiner

ACTIVE PROBE CARD FOR ELECTRICAL WAFER SORT OF INTEGRATED CIRCUITS

BACKGROUND

1. Technical Field

The present disclosure relates to a probe card system for wireless testing of integrated devices.

More specifically, the disclosure relates to a probe card system of a testing apparatus for testing integrated devices comprising a plurality of elementary wireless coupling elements able to allow a wireless transmission between the probe card system and a device to be tested and the following description is made with reference to this field of application for convenience of explanation only.

2. Description of the Related Art

As is well known, the electric selection of devices carried out on wafer, i.e., the so called Electric Wafer Sort (EWS) testing, includes electrically connecting a tester or ATE (acronym of "Automated Test Equipment") that executes measures on the wafer. A terminal portion of the testing apparatus is schematically shown in FIG. 1A, globally indicated with 1.

The wafer 6 includes a plurality of devices to be tested or selected, in particular chips 7 (also indicated as integrated circuits (IC). The interface between the ATE 1A and a wafer 6 is a so called probe card 2, which typically is a printed circuit board (PCB), and a probe head 3. The probe head 3 comprises different hundreds (several times thousands) of probes 4 that electrically connect the ATE 1A to almost all the contact pads 8 of a chip 7 to be tested, as shown in greater detail but always schematically in FIG. 1B. In particular, each end portion or tip 9 of the probes 4 comes into contact with a pad 8 of the chip 7 during a testing phase.

In general, the wafer 6 includes a plurality of chips 7 to be tested, and during the testing steps it is put on a support 5, shown in the portion of the testing apparatus 1, and belonging to an apparatus also called prober (not shown in the figure), this support 5 being thus also indicated as prober chuck.

The number of pads 8 for a testing can be smaller or equal to the total number of pads 8 of the chip 7 to be tested.

In a similar way, one goes further even if the chips 7 have bumps instead of pads 8, as it is well known to the technical experts in the field.

Before each chip 7 is encapsulated in a corresponding package, it is known that the testing of the chip 7 itself is executed, the chip 7 being still on the wafer 6, using the probes 4 that are connected directly to the pads 8 and that execute the so-called probing of the pad 8 they contact.

After the testing, the wafer 6 is cut and the chips 7 that have been tested and are operating are assembled in their package, ready for further process steps, also comprising further testing steps of the chips 7 in the package wherein they have been assembled.

In particular, similarly to the testing on wafer, the ATE is in particular able to execute a final test or FT (acronym of "Final Test") of what is contained in a package, electrically connecting the connections of the package itself.

In the case of SiP systems (acronym of "System In Package") there can be other situations, even very complex, further to the creation of electric connections between the various parts (chips, passive components, PCB, . . . ) of the system, these situations being well known to the technical experts in the field and in particular to the testing specialists.

It is also well known that a generic electronic system or chip is connected to the surrounding world through connections such as cabled channels (for example: cables, optical fibers, . . . ) or wireless channels, for example of the electromagnetic type. These connections allow to exchange information signals and/or to supply power to the same chips.

In case magnetic or electromagnetic signals are to be exchanged between an integrated circuit IC and at least another external system, the integrated circuit IC should have at least one receiver/transmitter inside. In the case of magnetic coupling these circuits are called transceiver/transponder, connected to at least one antenna that can be embedded in the integrated circuit IC itself. Examples of integrated circuits IC equipped with an antenna are the RFID circuits (acronym of "Radio Frequency Identification") or Smart Cards, that are low power integrated circuits (low power ICs), that can be supplied and exchange information by using electromagnetic waves through wireless channels (and thus without contact or contactless) that use an electromagnetic coupling obtained through at least two antennas.

In any case, the antennas of the embedded type, nowadays used for RFID or Smart Cards, have a limited communication range due to their sizes.

Electrodes for capacitive type transmission are also known, that use the generic pad of an integrated circuit IC as an armature of a capacitor, thus allowing a wireless probing.

A method and an apparatus for probing an integrated circuit through capacitive coupling are described for instance in the U.S. Pat. No. 6,600,325 in the name of Coates et al. According to this document, a system that performs electrical testing of a device by placing a probe conductor in proximity to (but not touching) a target conductor within the device is described.

US patent application published under No. US 2008/0018350 in the name of Chao et al. describes an apparatus for testing integrates circuits with ultra-fine pitch based on a passive interposer to adapt probe card sizes to pad sizes, still using a contact approach.

A similar solution is proposed by M. Daito et al in the paper 7.6 presented at ISSCC 2010 (page 144 of the IEEE proceeding) entitled "Capacitively Coupled Non-Contact Probing Circuits for Membrane Based Wafer Level Simultaneous Testing". A passive interposer is proposed to adapt the different pitches of a standard contact probe card and the DUT pads but in this solution a contactless approach is proposed to avoid the interconnect congestion.

Thus, it is highlighted that the contact solutions have different problems tied to the fact that the probe tips and the pads are damaged during the contact scrub of the probes and that the probe weight limits the test parallelism. Moreover, the contactless solutions, namely comprising a passive interposer, show an additional delay attenuation due to the passive interposer which limit the performance of the system as a whole.

BRIEF SUMMARY

One embodiment of the present disclosure is an apparatus for a wireless testing of integrated circuits, overcoming the limits and the drawbacks still affecting the methods realized according to the prior art.

One embodiment of the present disclosure is a probe card system for a testing apparatus with an active interposer wherein suitably arranged pads and at least an additional circuitry are realized.

One embodiment of the present disclosure is a probe card system of a testing apparatus for testing at least one integrated device. The probe card system includes at least one probe card connected to a tester of the testing apparatus, and at least an active interposer connected to the probe card and wirelessly coupled with a device to be tested. The active interposer includes a plurality of pads suitably arranged and disposed on its free surface facing said device to be tested, which in turn comprises a plurality of pads. The pads of the active interposer are positioned in a similar manner with respect to the pads of the device to be tested so as that each pad of the active interposer faces a pad of the device to be tested and is separated therefrom by a dielectric. Each pair of facing pads forms an elementary wireless coupling element which allow a wireless transmission between the active interposer and the device to be tested. The active interposer also includes additional circuitry performing at least an amplification of the wireless signals received from the device to be tested before forwarding them to the tester ATE. The probe card system also includes a transmission element able to allow the transmission of a power voltage from the tester to the device to be tested.

More in particular, the disclosure comprises the following supplemental and optional features, taken alone or in combination when needed.

According to an aspect of the disclosure, the active interposer may further comprise a plurality of conductive paths connecting its plurality of pads, by means of respective conductive through connections realized in the probe card, to a plurality of contact pads of the probe card itself, being duly arranged and disposed on its surface facing the tester of the testing apparatus.

According to another aspect of the disclosure, the transmission element may comprise at least one probe, protruding from the probe card and crossing the body of the active interposer through a hole suitably arranged therein, towards a corresponding pad of the device to be tested, said probe being able to transmit the power voltage to the device.

Moreover, according to still another aspect of the disclosure, the transmission element may comprise at least one power/ground pad realized on the active interposer and having a bigger size than the size of the other pads of the active interposer so as to be able to provide, in a wireless manner, the supply voltage to a corresponding pad of the device to be tested, said corresponding pad of the device to be tested substantially having a same size than the at least one power/ground pad of the active interposer.

According to an aspect of the disclosure, the conductive paths of the active interposer may comprise metal tracks and/or metalized vias and/or contact probes connecting the contact pads of the probe card and the pads of the active interposer.

Also according to another aspect of the disclosure, the probe card may be associated with the active interposer by using a flip-chip technology.

Still according to an aspect of the disclosure, the active interposer may comprise a semiconductor substrate, or a flexible substrate, or a glass substrate, or a substrate suitable for printed circuit manufacturing techniques.

According to another aspect of the disclosure, the probe card system may further comprise a probe head connected to the probe card and comprising a recess able to include the active interposer, being an active portion of an IC-based active interposer system in turn including a passive substrate in contact with the active interposer and having at least a portion facing the device to be tested.

In particular, according to this aspect of the disclosure, the passive substrate may comprise a plurality of pads, suitably arranged and disposed on its free surface facing the device to be tested and connected to the active interposer by means of conductive paths realized in the passive substrate, the pads of the passive substrate being disposed in a similar manner with respect to the pads of the device to be tested to form the elementary wireless coupling elements.

Yet according to this aspect of the disclosure, the active interposer may comprise a standard chip or a stacked configuration of chips, being realized in a not dedicated manner.

Moreover, the passive substrate may be a flexible layer having first and second wings disposed between the probe card and the probe head and a portion facing the device to be tested.

According to this aspect of the disclosure, the transmission element may comprise at least one probe, protruding from the probe head and crossing the body thereof through a suitably arranged hole towards a corresponding pad of the device to be tested, the probe being able to transmit the power voltage to the device.

Moreover, the conductive paths of the passive substrate may comprise metal tracks and/or metalized vias and/or contact probes connecting the pads of the passive substrate and suitable bumps of the active interposer.

Alternatively, the transmission element may comprise at least one power/ground pad being realized on the passive substrate of the IC-base active interposer system and having a bigger size than the size of the other pads so as to be able to provide, in a wireless manner, the supply voltage to a corresponding pad of the device to be tested, the corresponding pad of the device to be tested substantially having a same size than the at least one power/ground pad of the passive substrate.

According to another aspect of the disclosure, the passive substrate of the IC-based active interposer system may comprise pads being able to contact corresponding pads of the device to be tested by means of bumps.

According to another aspect of the disclosure, the probe card system may comprise a probe wafer substantially corresponding to at least a wafer portion including a plurality of devices previously tested and error-free proofed, the probe wafer comprising a plurality of active interposers, each facing at least a part of a devices to be tested of the wafer.

According to this aspect of the disclosure, the probe wafer may comprise the active interposers as modular elements, each active interposer having been previously tested and error-free proofed.

Moreover, the additional circuitry may further comprise on-board test circuitry performing some testing step on the device to be tested, the results of such testing steps being directly forwarded to the testing apparatus.

According to another aspect of the disclosure, the additional circuitry may also comprises a wireless power transmission circuit.

Finally, the wireless power transmission circuit may be chosen between a charge pump, a differential capacitive interface, a step up converter, a step down converter, an AC/DC converter and a DC/AC converter.

The characteristics and advantages of the probe card system according to the disclosure will be apparent from the following description of an embodiment thereof given by way of indicative and non limiting example with reference to the annexed drawings.

DETAILED DESCRIPTION

Figure 1:
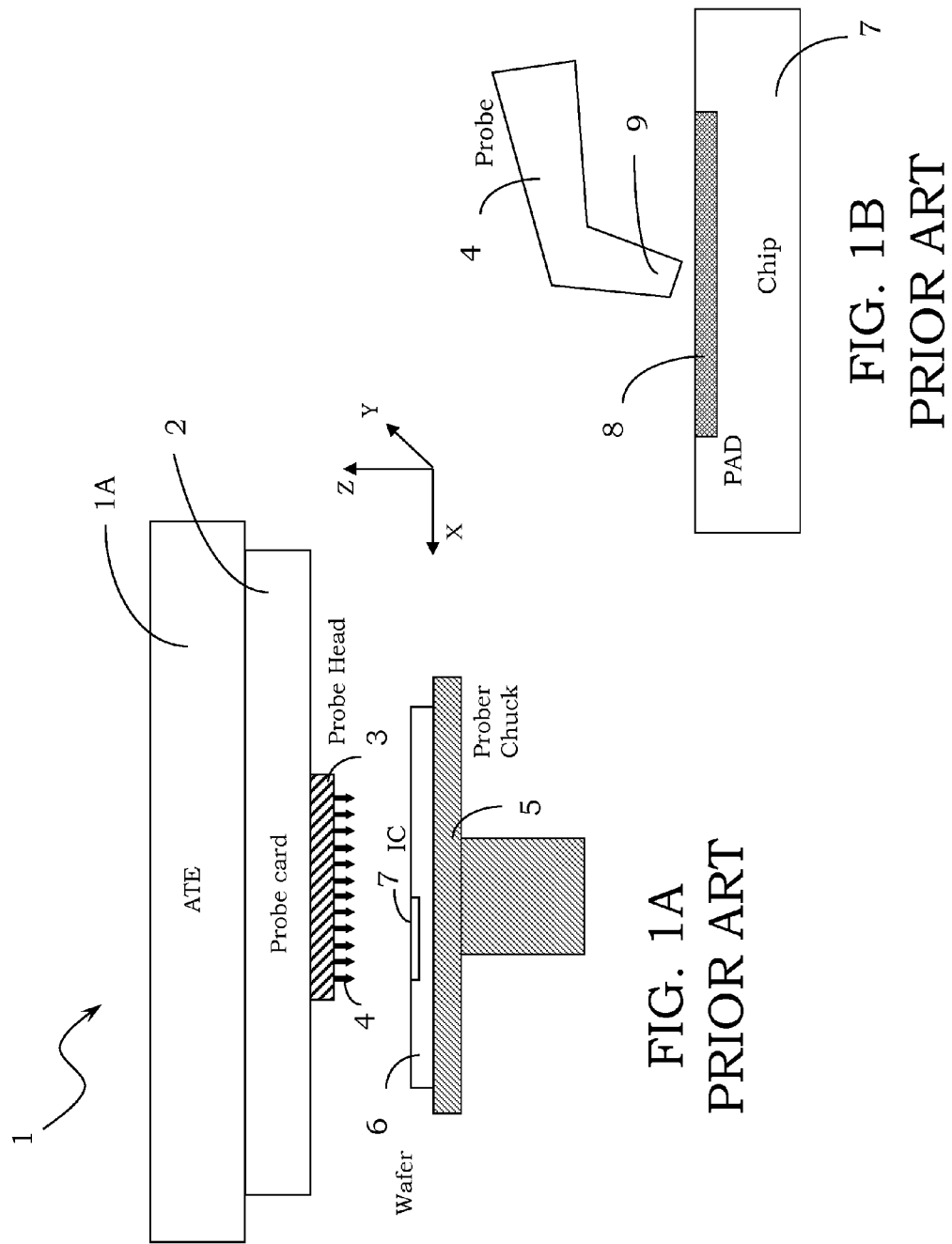
FIG. 1A schematically shows a terminal portion of a probe testing apparatus being realized according to the prior art.
FIG. 1B schematically shows in greater detail a part of the terminal portion of FIG. 1A.
Figure 2:
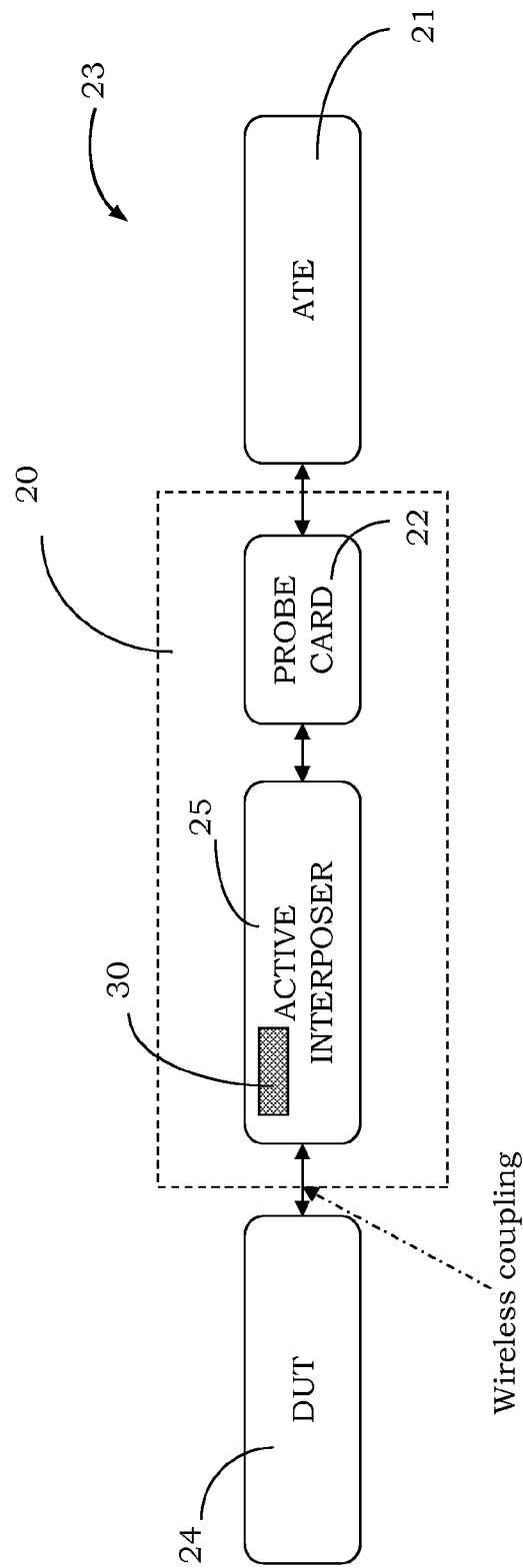
FIG. 2 schematically shows a diagram of a probe card system for a testing apparatus realized according to the disclosure.

With reference to such figures, and in particular to FIG. 2, a probe card system is shown, globally indicated with 20.

The probe card system 20 is inserted between a tester or ATE 21, which is part of a testing apparatus 23, and at least a device 24 to be tested or selected, usually a wafer comprising a plurality of devices to be tested or selected.

More in particular, the probe card system 20 comprises a probe card 22, which may be of a traditional type, and an active interposer 25 connected to the probe card 22 and wirelessly coupled to the device 24 to be tested. As will be clear from the following description of different embodiments of the probe card system 20 according to the disclosure, the active interposer 25 comprises a plurality of suitably arranged pads and additional circuitry 30, which also comprises at least an amplification circuit.

Moreover, the probe card system 20 further comprises a transmission element (51A, 51B, 51C, 51D of FIGS. 3-6, respectively) able to provide the device 24 to be tested with a power voltage, in particular a power supply/ground voltage.

In the following description, numerous specific details are given to provide a thorough understanding of embodiments. The embodiments can be practiced without one or more of the specific details, or with other methods, components, materials, etc. In other instances, well-known structures, materials, or operations, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

Moreover, to structurally and/or functionally equal elements described with reference to the different embodiments, corresponding reference numbers will be applied.

Finally, the figures are not drawn in scale, being on the contrary drafted so as to emphasize the important features of the disclosure.

Figure 3:
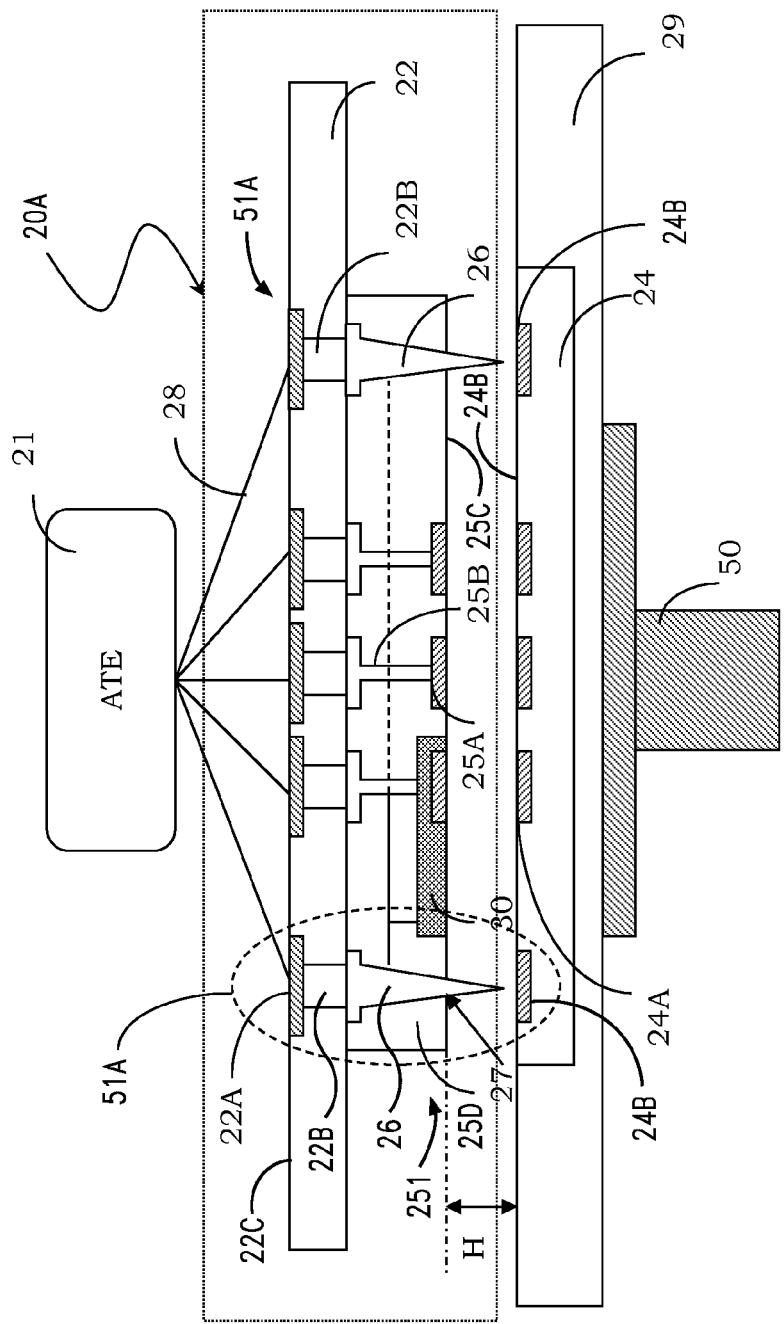
FIG. 3 schematically shows a first embodiment of the probe card system of FIG. 2.

A probe card system 20A according to a first embodiment of the present disclosure is shown in FIG. 3. In particular, the probe card system 20A is coupled between the ATE 21 and the device 24 to be tested which is part of a wafer 29 comprising a plurality of devices. The wafer 29 is supported by a mechanical support, for instance a prober chuck 50 as described with reference to the prior art. The device 24 to be tested is also provided with a plurality of pads 24A, duly arranged and disposed on its free surface 24B facing the probe card system 20A. A plurality of connections 28, in particular wire connections, connect the probe card system 20A and the ATE 21, also providing for a correct routing of the signals between the probe card system 20A and the ATE 21.

More in particular, the probe card system 20A comprises at least a probe card 22 associated with an active interposer 251. The probe card 22 is coupled between the ATE 21 and the active interposer 251, in turn facing the device 24 to be tested.

The probe card 22 may be provided with a plurality of contact pads 22A duly arranged and disposed on its surface 22C facing the ATE 21, each contact pad 22A being connected to the tester ATE 21 by a respective connection 28. The probe card 22 also comprises a plurality of conductive through connections 22B, for instance metalized through vias, each conductive through connection 22B extending through the body of the probe card 22 from a respective contact pad 22A toward the active interposer 251.

According to this first embodiment of the disclosure, the probe card 22 is also associated with the active interposer 251, for instance by using a flip-chip technology.

The active interposer 251 then comprises a plurality of pads 25A, suitably arranged and disposed on its free surface 25C facing the device 24 to be tested and connected to the contact pads 22A of the probe card 22 by conductive paths 25B, such as and/metal tracks or metalized vias, realized in the active interposer 251 and by the conductive through connections 22B realized in the probe card 22. In particular, the pads 25A of the active interposer 251 are disposed in a similar manner with respect to the pads 24A of the device 24 to be tested. In this way, each pad 25A of the active interposer 251 faces a pad 24A of the device 24 to be tested, being separated therefrom by a dielectric, which can be, but not necessarily is, air. The thickness H of the dielectric corresponds to the distance between the active interposer 251 and the device 24 to be tested.

It should be remarked that the pads 24A and 25A are realized by a conductive material and, in one embodiment, they are obtained from a metal layer as it is well known in the manufacturing technologies of integrated circuits. It is thus clear that each pair of facing pads 24A, 25A forms an elementary wireless coupling element.

Hence, the plurality of pads 25A realized in the active interposer 251 according to an arrangement fully equivalent to the one of the pads 24A of the device 24 to be tested realizes a plurality of elementary wireless coupling elements which allows a wireless signal transmission between the probe card system 20 and the device 24 to be tested. In order to ensure a correct wireless signal transmission, the distance H between the active interposer 251 and the device 24 may be in the order of few microns.

Moreover, the active interposer 251 suitably comprises additional circuitry 30. More in particular, the additional circuitry 30 may comprise an amplification circuit which pre-processes the wireless signals provided by the elementary wireless coupling elements formed by the pairs of pads 24A, 25A, usually quite low signals which are difficult to be directly processed by the ATE 21. Hence, the amplification circuit of the additional circuitry 30 amplifies or also regenerates the wireless signals from the device 24 to be tested, thanks to the wireless coupling with the active interposer 251, before forwarding the same to the ATE 21.

Moreover, the additional circuitry 30 may also comprise on-board test circuitry able to process the wireless signals as received by the device 24 to be tested, in particularly thanks the wireless (namely capacitive) coupling realized by the elementary wireless coupling (namely capacitive) elements formed by the pairs of facing pads 24A, 25A. In particular, the on-board test circuitry of the additional circuitry 30 may take care of some testing steps of the device 24 to be tested, the results of such tests being thus directly forwarded to the ATE 21.

The probe card system 20A may also advantageously comprise transmission elements 51A connecting the ATE 21 and the device 24 to be tested and providing thereto a voltage, in particular a power supply/ground voltage, generically indicated as power voltage.

More in particular, as shown in FIG. 3, each transmission element 51A may comprise a probe 26 protruding from the surface 25C of active interposer 251 and a conductive through connection 22B contacting the probe 26. The probe 26 extends completely through a hole that extends through the body 25D of the active interposer 251. In particular, the probe 26 is able to contact a corresponding pad 24B of the device 24 to be tested in order to transmit a power supply and/or ground voltage, the pad 24B of the device 24 to be tested being a power supply pad. In this way, the device 24 to be tested is correctly powered by the transmission element 51A comprising the probe 26. The through connections 22B extend through the probe card 22 and respectively contact corresponding pads 22A connected to the ATE 21 by the connections 28.

According to an aspect of the disclosure, the active interposer 251 is realized as an integrated circuit on a semiconductor substrate, namely a silicon substrate. It should be remarked that the different elements of the active interposer 251 (the pads 25A, the conductive paths 25B as well as the additional circuitry 30) may be easily and at a low cost realized on a semiconductor substrate by using standard integration processes.

According to another aspect of the disclosure, the active interposer 251 may comprise a flexible substrate, for instance made of a polymer, whereon the different elements of the active interposer 251 are realized. Such elements may be also embedded into the flexible substrate of the active interposer 251. Moreover, a glass substrate could be alternatively used, applying appropriate techniques in order to realize the different elements of the active interposer 251 thereon.

Finally, the active interposer 251 may comprise a substrate suitable for printed circuit manufacturing techniques, such as the FR4 (Flame Retardant). In this case, a low cost printed circuit board (PCB) technology may be used to realize both the probe card 22 and the active interposer 251.

Figure 4:
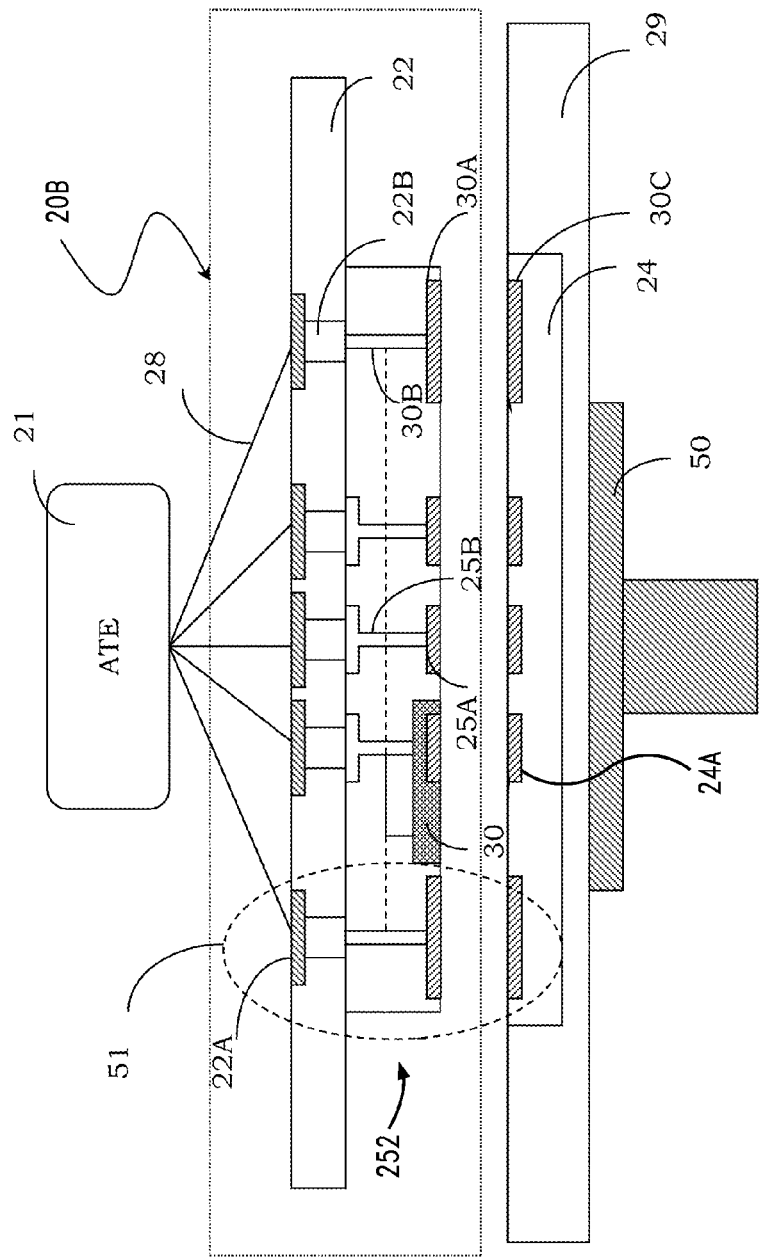
FIG. 4 schematically shows a second embodiment of the probe card system of FIG. 2.

A probe card system 20B according to a second embodiment of the present disclosure is shown in FIG. 4.

According to this second embodiment, an active interposer 252 comprises at least a power/ground pad 30A having a bigger size than the size of the other pads 25A and being able to provide, in a wireless manner, a supply and/or ground voltage to a corresponding pad 30C of the device 24 to be tested, so as to correctly powering it. In particular, the size of the pads 30A and 30C are substantially equal, so as to enable a transmission of a power voltage. In this case, the transmission element 51" comprises the facing bigger pads 30A and 30C. It should be remarked that the equivalent coupling capacitance of such facing pads, 30A and 30C, and thus the transmission efficiency of the transmission element 51", is tied to their facing areas.

The transmission element 51B also comprises suitable conductive paths 30B extending through the body 25D of the active interposer 252 and connecting the power/ground pads 30A to the conductive through connections 22B of the probe card 22.

Figure 5:
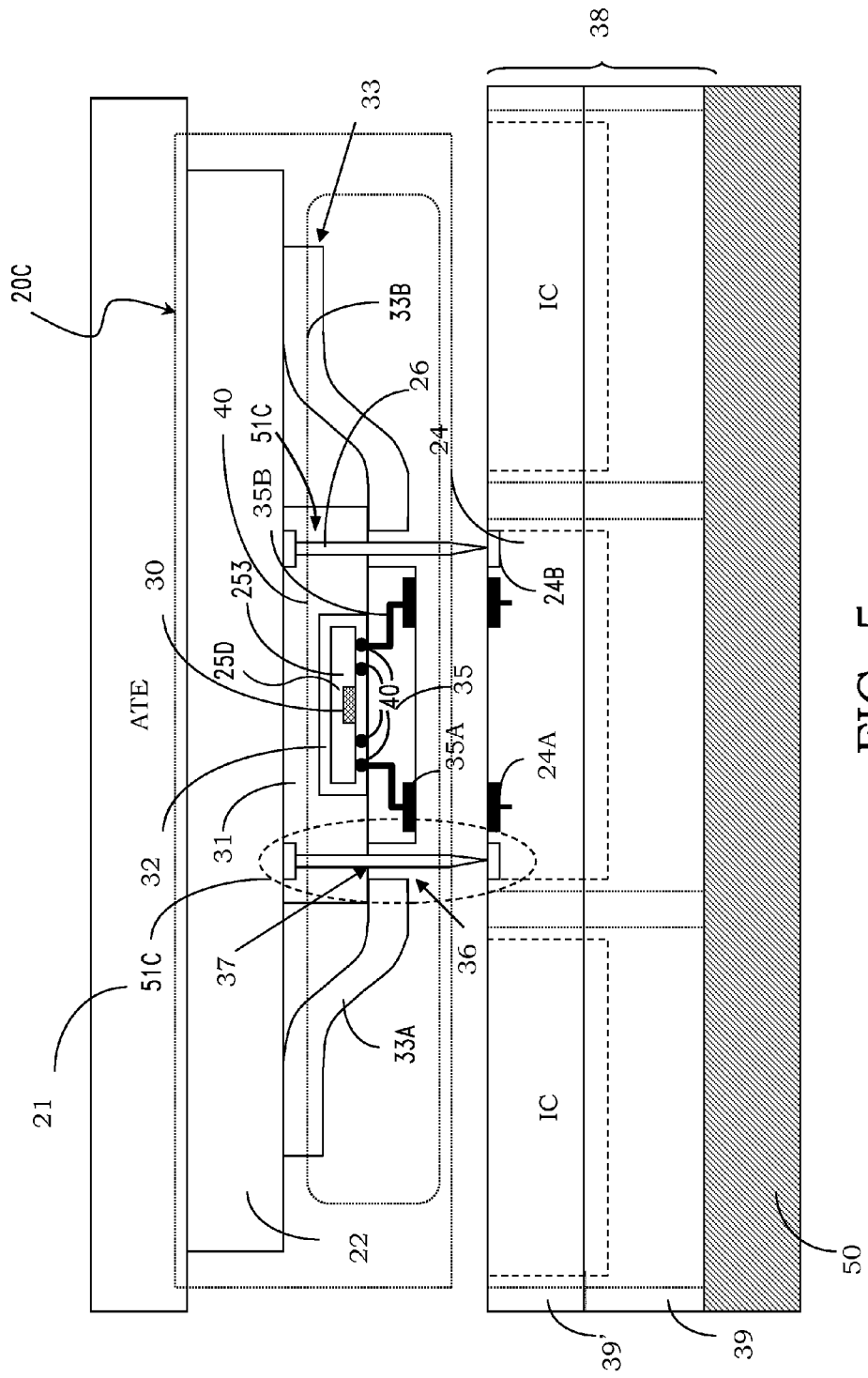
FIG. 5 schematically shows a third embodiment of the probe card system of FIG. 2.

A probe card system 20C according to a third embodiment of the present disclosure is shown in FIG. 5.

According to this third embodiment, the probe card system 20C comprises a probe head 31 and an IC-based active interposer system 40 connected to the probe card 22. In particular, the IC-based active interposer system 40 comprises a passive substrate 33 having at least a portion 35 facing the device 24 to be tested as well as a body 25D of an active interface 253 included in a recess 32 of the probe head 31.

Moreover, according to this embodiment, the body 25D of the active interposer 253 comprises the additional circuitry 30 which is electrically coupled to the passive substrate 33, for instance by means of bumps 40. The passive substrate 33 comprises a plurality of pads 35A, suitably arranged and disposed on its free surface facing the device 24 to be tested and connected to the additional circuitry 30 by means of conductive paths 35B, such as metal tracks or metalized vias, realized in the passive substrate 33 and the bumps 40. In particular, the pads 35A of passive substrate 33 are disposed in a similar manner with respect to the pads 24A of the device 24 to be tested. In this way, each pad 35A faces a pad 24A, being separated therefrom by a dielectric, in particular air and thus forming an elementary wireless coupling element. The thickness H of the dielectric corresponds to the distance between the passive substrate 33 and the device 24 to be tested.

It should be remarked that, advantageously according to the disclosure, the conductive paths 35B are really short.

The elementary wireless coupling elements formed by the pairs of facing pads 24A, 35A realize the wireless coupling, in particular the wireless coupling between the device 24 to be tested and the passive substrate 33. The wireless signals received by the device 24 to be tested are then forwarded to the active interposer 253, thanks to the conductive paths 35B.

It should be noted that, in this case, a standard chip or a stacked configuration of chips may realize the active interposer 253, suitably disposed in the recess 32 of the probe head 31. Also in this case, the active interposer 253 comprises at least the additional circuitry 30, in particular comprising an amplification circuit.

The active interposer 253 may be thus realized in a not dedicated manner, with the correct routing being provided.

According to one embodiment of the disclosure, the passive substrate 33 is a flexible layer having first and second wings, 34A and 34B, disposed between the probe card 22 and the probe head 31 and a portion 35 facing the device 24 to be tested. A flexible PCB may be used to realize the flexible layer. In this way, the changing of the signal routing for the IC based active interposer system 40, in particular using the same active interposer, may be easily realized and at low costs by simply changing the design of the metal layers realized on the flexible material of the passive substrate 33.

It should be remarked that, the passive substrate 33, including the portion 35, is a flexible layer, and may be totally put into contact with a wafer surface, so as to enhance the capacitive coupling between the probe card system 20 and the wafer itself.

Also in this case, the probe card system 20C may also advantageously comprise transmission elements 51C connecting the ATE 21 and the device 24 to be tested and providing thereto a power voltage, in particular a power supply/ground voltage.

In particular, each transmission element comprises at least one probe 26, protruding from the probe head 31 and crossing the body thereof through a suitably arranged hole 37 in the probe head, thus contacting a corresponding power supply pad 24B of the device 24 to be tested. The probe 26 may be housed in a suitably arranged through hole 36 realized in the flexible layer forming the passive substrate 33. In particular, the probe 26 is able to transmit to the device 24 to be tested a power supply and/or ground voltage, thus realizing the transmission element 51C.

The device 24 to be tested is usually realized in a wafer 38, in particular in a substrate 39 and in an active layer 39' thereof, the wafer 38 being supported by a mechanical support, for instance the prober chuck 50.

Figure 6:
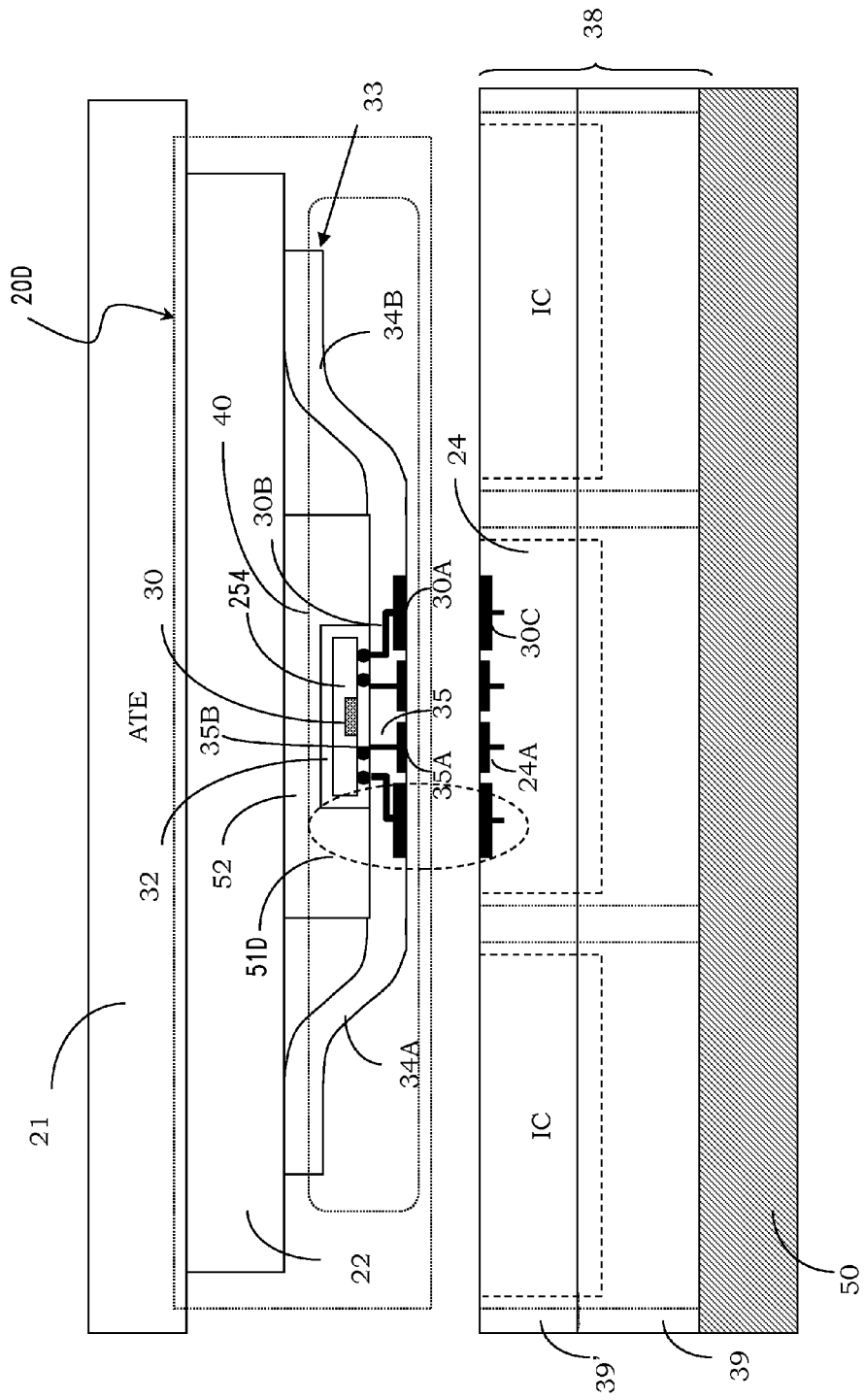
FIG. 6 schematically shows a fourth embodiment of the probe card system of FIG. 2.

A probe card system 20D according to a fourth embodiment of the present disclosure is shown in FIG. 6.

According to this fourth embodiment, the passive substrate 33 of the IC-based active interposer system 40 comprises at least a power/ground pad 30A having a bigger size than the size of the other pads 35A and being able to provide, in a wireless manner, a supply and/or ground voltage to a corresponding pad 30C of the device 24 to be tested, so as to correctly powering it. In particular, the size of the pads 30A and 30C substantially corresponds, so as to enable a transmission of a power voltage. In this case, the transmission element 51D comprises the facing bigger pads 30A and 30C. It should be remarked that the equivalent coupling capacitance of such facing pads, 30A and 30C, and thus the transmission efficiency of the transmission element 51D, is tied to their facing areas.

The passive substrate 33 also comprises suitable conductive paths 30B connecting the power/ground pads 30A to the active portion of the IC-based active interposer system 40, i.e., to the active interposer 254.

Also in this case, the probe card system 20D comprises a support 52 connected between the probe card 22 and the passive substrate 33 and having a recess 32 that includes the active interposer 254. The support 52 may have elastic characteristics to avoid wafer damaging due to the possible contact of the portion 35 with the wafer surface. The support 52 may be also omitted and the recess 32 may be created in the probe card 22. In this case, the passive substrate 33 may be rigid.

Figure 7:
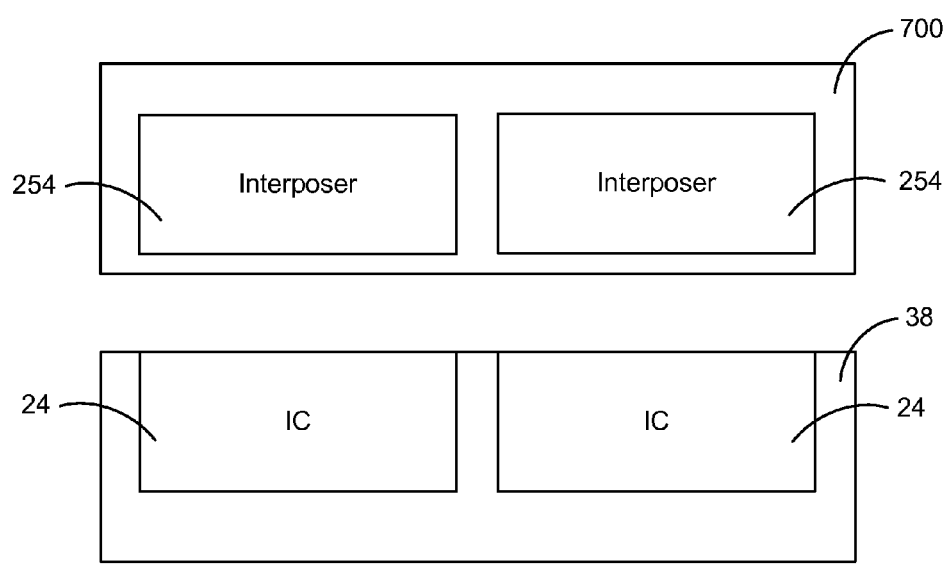
FIG. 7 schematically shows an embodiment of a probe card system.

It should be remarked that the probe card system 20D may comprises a wafer probe 700, substantially corresponding to at least a portion of a wafer including a plurality of devices previously tested and error-free proofed and including a plurality of active interposers 254 as modular elements, such active interposers 254 having been previously singularly tested and error-free proofed, as shown in FIG. 7. In particular, each active interposer 254 may have a same size with respect to a device 24 to be tested, thus providing a testing of at least a part of a device at once. It may be also possible to design an active interposer 254 smaller than a device 24 to be tested, thus providing a testing only of a portion thereof, as well as an active interposer 254 bigger than a device 24 to be tested, for instance having the size of two devices 24 to be tested, thus providing at least a partial testing of the two devices at once. The wafer probe 700 may also comprise active interposers 254 each having a different size.

Moreover, the IC-based active interposer system 40 may comprise pads 35A of its passive substrate 33 being able to contact corresponding pads 24A of the device 24 to be tested. In this aim, bumps may be provided on the surface of these pads 25A and/or 35A.

Finally, the additional circuitry 30 may also comprise a wireless power transmission circuit, namely as a charge pump, a differential capacitive interface, a step up converter, a step down converter, an AC/DC converter, a DC/AC converter, to name few.

According to some embodiments of the disclosure, a wireless probing is provided by a probe card system comprising an active interposer including a plurality of pads facing a corresponding plurality of pads of a device to be tested, thus forming a plurality of elementary wireless coupling elements which ensure a wireless transmission of signals between the device to be tested and the probe card system, and thus to a tester ATE of a testing apparatus.

Advantageously according to the disclosure, the active interposer also comprises additional circuitry being able to amplify the usually low wireless signals, so as to ensure their correct processing by the testing apparatus. A pre-processing of such wireless signals as well as complete testing steps can be also performed by the additional circuitry.

According to advantageous aspects of the disclosure, the probe card system may also comprise a transmission element in the form of at least one probe, protruding from the probe card towards the device to be tested in order to transmit a power supply and/or ground voltage and/or at least a power/ground pad having a bigger size than the size of the other pads and being able to provide to another substantially equally sized pad of the device to be tested, in a wireless manner, such a supply and/or ground voltage, the device to be tested being thus correctly powered. Moreover, the active interposer 25 may comprise a semiconductor or a flexible substrate.

According to other embodiments of the disclosure, the probe card system may comprise a probe head connected to the probe card and to an IC-based active interposer system comprising an active portion acting as an active interposer and a passive substrate facing the device to be tested, the probe head comprising a recessed portion able to house the active interposer. In this case, a standard chip or a stacked configuration of chips may realize the active interposer in a not dedicated manner.

Also, the probe card system may comprise a wafer probe substantially corresponding to at least a wafer portion including a plurality of devices previously tested and error-free proofed the wafer probe comprising a plurality of active interposers facing the devices to be tested, in particular as modular elements. The active interposers 25 may have same sizes with respect to the devices to be tested, each active interposer providing at least a partial testing of one device at once. It may be also possible to design an active interposer smaller than a device to be tested, thus providing a testing only of a portion thereof, as well as an active interposer bigger than a device to be tested, for instance having the size of two devices to be tested, thus providing at least a partial testing of the two devices at once.

Obviously, a technician of the field, aiming at meeting incidental and specific needs, will bring several modifications to the above described system, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A probe card system for a testing apparatus, comprising:
   a probe card configured to be coupled to a tester of the testing apparatus, an active interposer coupled to the probe card and configured to be wirelessly coupled with a device to be tested that includes a plurality of pads, said active interposer including:
  a free surface configured to face the device;
  a plurality of pads positioned on the free surface and configured to respectively face the pads of the device and to be separated from the pads of the device by a dielectric, each pad of the active interposer being configured to form, with the respective pad of the device, an elementary wireless coupling element that allows a wireless transmission between the active interposer and the device; and
  an amplifier circuit configured to amplify wireless signals from the device and forward the amplified wireless signals to the tester; and
a transmission element coupled to the active interposer and configured to transmit a supply voltage to the device.

2. A probe card system according to claim 1, wherein:
said probe card includes a body, a surface configured to face the tester, a plurality of contact pads positioned on the surface of the probe card, and a plurality of conductive through connections extending through the body of the probe card; and
said active interposer further comprises a plurality of conductive paths respectively coupling the pads of the active interposer, by via the through connections, to the contact pads of the probe card.

3. A probe card system according to claim 1, wherein the active interposer includes a body with a hole extending completely through the body of the active interposer, and said transmission element comprises a probe protruding from the probe card and crossing the body of the active interposer through the hole, said probe being configured to contact a corresponding pad of the device transmit the supply voltage to said device.

4. A probe card system according to claim 1, wherein said transmission element comprises a power/ground pad realized on said active interposer and having a bigger size than the pads of the plurality of pads of the active interposer and configured to provide, in a wireless manner, the supply voltage to a corresponding pad of the device.

5. A probe card system according to claim 1, wherein the active interposer comprises a semiconductor substrate, or a flexible substrate, or a glass substrate, or a substrate suitable for printed circuit manufacturing techniques.

6. A probe card system according to claim 1, comprising a probe head coupled to the probe card and including a recess, wherein the active interposer includes a body positioned in the recess of the probe head and a passive substrate in contact with the body of the active interposer and having at least a portion configured to face the device.

7. A probe card system according to claim 6, wherein:
the free surface of the active interposer is a free surface of the passive substrate;
the pads of the active interposer are positioned on the free surface of the passive substrate;
the body of the active interposer houses the amplifier circuit;
the active interposer includes a plurality of conductive bumps coupled to the amplifier circuit and positioned on the body of the active interposer; and
said passive substrate comprises conductive paths coupling the pads of the active interposer to the conductive bumps.

8. A probe card system according to claim 6, wherein said passive substrate is a flexible layer having first and second wings coupled between the probe card and the probe head and a portion configured to face the device.

9. A probe card system according to claim 6, wherein said probe head includes a body and a hole extending completely through the body, and said transmission element comprises a probe positioned in the hole in the body of the probe head, protruding from the probe head, configured to extend towards a corresponding pad of the device, and configured to transmit the supply voltage to said device.

10. A probe card system according to claim 6, wherein said transmission element comprises at least one power/ground pad realized on said passive substrate and having a bigger size than the pads of the plurality of pads of the active interposer and configured to provide, in a wireless manner, the supply voltage to a corresponding pad of said device.

11. A probe card system according to claim 1, comprising a wafer probe that includes a plurality of active interposers, each configured to face a respective device to be tested of a wafer.

12. A probe card system according to claim 1, further comprising on-board test circuitry positioned in the active interposer and configured to perform some testing steps on the device and forward results of such testing steps to the testing apparatus.

13. A probe card system according to claim 1, further comprising a wireless power transmission circuit positioned in the active interposer and configure to supply the supply voltage to the transmission element.

14. A testing apparatus, comprising:
a tester;
a probe card electrically coupled to the tester;
an active interposer coupled to the probe card and configured to be wirelessly coupled with a device to be tested that includes a plurality of pads, said active interposer including:
  a free surface configured to face the device;
  a plurality of pads positioned on the free surface and configured to respectively face the pads of the device and to be separated from the pads of the device by a dielectric, each pad of the active interposer being configured to form, with the respective pad of the device, an elementary wireless coupling element that allows a wireless transmission between the active interposer and the device; and
  an amplifier circuit configured to amplify wireless signals from the device and forward the amplified wireless signals to the tester; and
a transmission element coupled to the active interposer and configured to transmit a supply voltage to the device.

15. A testing apparatus according to claim 14, wherein:
said probe card includes a body, a surface configured to face the tester, a plurality of contact pads positioned on the surface of the probe card, and a plurality of conductive through connections extending through the body of the probe card; and
said active interposer further comprises a plurality of conductive paths respectively coupling the pads of the active interposer, by via the through connections, to the contact pads of the probe card.

16. A testing apparatus according to claim 14, wherein the active interposer includes a body with a hole extending completely through the body of the active interposer, and said transmission element comprises a probe protruding from the probe card and crossing the body of the active interposer through the hole, said probe being configured to contact a corresponding pad of the device transmit the supply voltage to said device.

17. A testing apparatus according to claim 14, wherein said transmission element comprises a power/ground pad realized on said active interposer and having a bigger size than the pads of the plurality of pads of the active interposer and configured to provide, in a wireless manner, the supply voltage to a corresponding pad of the device.

18. A testing apparatus according to claim 14, comprising a probe head coupled to the probe card and including a recess, wherein the active interposer includes a body positioned in the recess of the probe head and a passive substrate in contact with the body of the active interposer and having at least a portion configured to face the device.

19. A testing apparatus according to claim 18, wherein:
the free surface of the active interposer is a free surface of the passive substrate;
the pads of the active interposer are positioned on the free surface of the passive substrate;
the body of the active interposer houses the amplifier circuit;
the active interposer includes a plurality of conductive bumps coupled to the amplifier circuit and positioned on the body of the active interposer; and
said passive substrate comprises conductive paths coupling the pads of the active interposer to the conductive bumps.

20. A testing apparatus according to claim 18, wherein said probe head includes a body and a hole extending completely through the body, and said transmission element comprises a probe positioned in the hole in the body of the probe head, protruding from the probe head, configured to extend towards a corresponding pad of the device, and configured to transmit the supply voltage to said device.

21. An active interposer for a testing apparatus for testing a device that includes a plurality of pads, the active interposer comprising:
a body configured to be coupled to a probe card of the testing apparatus, the body including a free surface configured to face the device;
a plurality of pads positioned on the free surface and configured to respectively face the pads of the device and to be separated from the pads of the device by a dielectric, each pad of the active interposer being configured to form, with the respective pad of the device, an elementary wireless coupling element that allows a wireless transmission between the active interposer and the device;
an amplifier circuit configured to amplify wireless signals from the device and forward the amplified wireless signals to the tester; and
a transmission element configured to transmit a supply voltage to the device.

22. An active interposer according to claim 21, comprising a hole extending completely through the body, wherein said transmission element comprises a probe crossing the body through the hole, said probe being configured to be electrically coupled to the probe card and contact a corresponding pad of the device transmit the supply voltage to said device.

23. An active interposer according to claim 21, wherein said transmission element comprises a power/ground pad positioned on said body and having a bigger size than the pads of the plurality of pads of the active interposer and configured to provide, in a wireless manner, the supply voltage to a corresponding pad of the device.

24. An active interposer according to claim 21, comprising a passive substrate in contact with the body of the active interposer and having at least a portion configured to face the device.

25. An active interposer according to claim 24, wherein:
the free surface of the active interposer is a free surface of the passive substrate;
the pads of the active interposer are positioned on the free surface of the passive substrate;
the body houses the amplifier circuit;
the active interposer includes a plurality of conductive bumps coupled to the amplifier circuit and positioned on the body; and
said passive substrate comprises conductive paths coupling the pads of the active interposer to the conductive bumps.

* * * * *